United States Patent [19]

Vandegraaf

[11] Patent Number: 4,511,863

[45] Date of Patent: Apr. 16, 1985

[54] COMBINED MODULATION AND TEMPERATURE COMPENSATION CIRCUIT

[75] Inventor: Johannes J. Vandegraaf, Lynchburg, Va.

[73] Assignee: General Electric Company, Lynchburg, Va.

[21] Appl. No.: 477,609

[22] Filed: Mar. 22, 1983

[51] Int. Cl.$^3$ ............................................. H03C 3/08
[52] U.S. Cl. ................................. 332/18; 331/116 R; 331/176
[58] Field of Search ............... 332/18, 30 V; 331/66, 331/176, 158, 116 R

[56] References Cited

U.S. PATENT DOCUMENTS 3,995,233  11/1976  Waku ............................... 331/176 X
4,254,382  3/1981  Keller et al. ..................... 331/176 X Primary Examiner—Eugene R. LaRoche
Assistant Examiner—Robert J. Pascal
Attorney, Agent, or Firm—Cushman, Darby & Cushman

[57] ABSTRACT

A circuit arrangement for combining a temperature compensating signal from a temperature compensator with a modulation signal to provide a combined signal for driving one or more crystal oscillators independently. The combining is carried out in such a manner that there is a constant predetermined ratio between the magnitudes of the temperature compensating and modulating signals. A potentiometer level controls the combined signal to each oscillator independently without changing the predetermined ratio. Thus, the effect of circuit element tolerances on temperature compensation is automatically corrected for while the central oscillation frequency in the absence of modulation is substantially unaffected.

22 Claims, 3 Drawing Figures

COMBINED MODULATION AND TEMPERATURE COMPENSATION CIRCUIT

BACKGROUND OF THE INVENTION

This invention relates in general to crystal oscillators. More particularly, the invention relates to the temperature compensation of modulated crystal oscillator circuits.

In modern FM transmitter design practice, a direct frequency modulated crystal controlled oscillator is generally used as the primary frequency source. Typically, a varicap diode is employed as the modulating element. A bias is established for this diode and this bias is varied by application of a modulating signal superimposed on it. A typical representative circuit of this type is shown in FIG. 1 (PRIOR ART).

Referring to FIG. 1, the crystal (XTAL) controls the oscillator frequency and is operated near series resonance. The combination of crystal XTAL, inductor L1, varicap diode C1 and capacitors C2, C3 and C4 constitutes a resonant circuit of a Colpitts-type oscillator.

We denote the motional inductance of crystal XTAL as $L_s$. The following relationship exists:

$$\Delta X_{c1} = 2L_s \Delta W \quad (1)$$

$$\Delta X_{c1} \approx \frac{\Delta C_1}{C_1} \times X_{c1} \quad (2)$$

$$\text{or } \Delta W = \frac{X_{c1}}{2L_s} \times \frac{\Delta C_1}{C_1} \quad (3)$$

where $\Delta X_{c1}$ = change in the reactance of the varicap and $\Delta W$ is the change in the oscillator frequency resulting from a change in the varicap capacity $C_1$.

To achieve adequate frequency stability over a wide temperature range, it is generally necessary to temperature compensate the oscillator circuit. Such temperature compensation is necessary because the resonant frequency of crystal XTAL is temperature dependent. Temperature compensation is usually accomplished by applying a temperature dependent voltage to varicap diode C1. Accurate temperature compensation is not particularly difficult for an individual oscillator which has known behavior if the bias of the varicap can be made appropriately temperature dependent. This is because the effect of the tolerances of LS and C1 can be readily absorbed. It is only necessary to determine the crystal resonant frequency as a function of temperature and then construct a circuit for applying the appropriate compensating temperature function to the DC bias applied to varicap diode C1.

Despite the fact that it is relatively simple to construct such a circuit for an individual oscillator, temperature compensation is not so simple when the oscillator is part of an overall circuit in which the crystal itself may be switched to change frequency. Under such circumstances, the solution to the temperature compensation problem becomes rather complex. A different amount of control is required due to the tolerance effect of $L_s$ and C1. The tolerance on $L_s$ is of the order of ±25%, that of the varicap diode C1 is ±15%. Furthermore, the motional inductance $L_s$ is frequency dependent. Thus, oscillators operating at different frequencies require different compensation voltages.

It would be highly desirable to be able to compensate for these tolerances without actually making measurements on the oscillator circuit or changing circuit elements. In the case of an oscillator that is to be frequency modulated, as in the case of an FM transmitter, the modulation level of control can be used to automatically provide the required temperature compensation for the oscillator by appropriately combining the modulation input from an audio circuit with a DC output of a temperature compensation circuit so that the composite signal can be applied to varicap diode C1 to produce both the proper modulation level and the required temperature compensation.

As a practical matter, such a scheme can be readily implemented. FCC regulations governing radio transmission over the airwaves require for certain radio services a modulation limiter circuit providing an accurately defined audio maximum signal level. This accurately defined audio maximim signal level provides a known transmitter frequency deviation, such as for example, 4 kHz. peak deviation. This deviation is typically set with a modulation potentiometer. If the proper amount of DC control input is coupled to the same modulation potentiometer, adjustment for proper frequency deviation will automatically produce the appropriate amount of temperature compensation regardless of component tolerances of the oscillator circuit. However, by combining these functions, there can be a certain degree of interaction between the frequency deviation adjustment and the center frequency setting. In other words, setting the deviation affects the center frequency. It is a cumbersome procedure to obtain the appropriate center frequency setting while at the same time achieving the desired deviation.

SUMMARY OF THE INVENTION

Therefore, the present invention provides a combined circuit for modulating and temperature compensating one or more crystal oscillators which eliminates this operational difficulty. In essence, the output of a temperature compensaton circuit (providing a temperature dependent voltage for compensating the temperature function of resonant frequency) is combined with an audio signal for modulating the oscillator in such a manner that the ratio of the magnitudes of the temperature compensating and modulating signals is constant and predetermined. A potentiometer is used to adjust the overall level of the combined signal to each crystal oscillator without affecting this predetermined ratio.

One arrangement for accomplishing this desired result is to utilize an operational amplifier circuit for combining modulation audio with a temperature compensator output. A potentiometer at the output of the operational amplifier supplies level controlled combined modulation and temperature compensating signals having the constant predetermined ratio to one or more crystal oscillators.

In some applications it is not possible to use an operational amplifier combining circuit because of DC supply voltage limitations. Therefore, there is also provided an alternative embodiment utilizing a bridge circuit configuration for combining a modulating audio signal with a temperature compensation signal from a combined temperature compensating and modulation signal having a predetermined constant ratio. The potentiometer is part of the bridge configuration and supplies a level controlled combined signal without changing the ratio.

Other circuit arrangements are possible based upon the principles embodied in these two approaches.

BRIEF DESCRIPTION OF THE DRAWINGS

The invention will be described further with reference to the drawings.

DETAILED DESCRIPTION OF THE PREFERRED EMBODIMENTS

Figure 1:
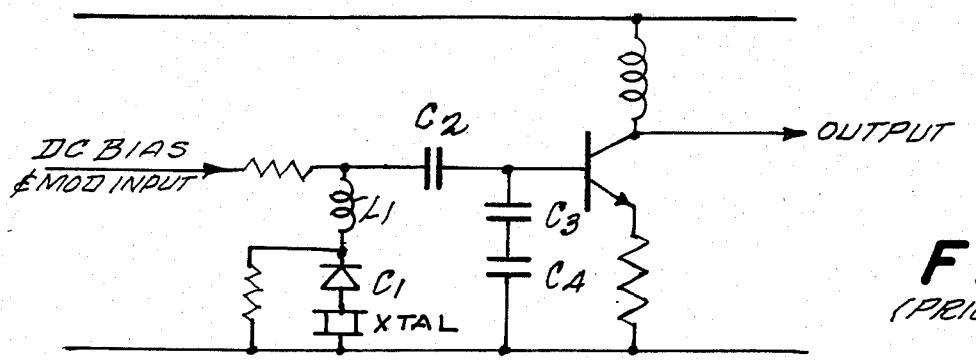
FIG. 1 (PRIOR ART) is a schematic drawing of a typical varicap diode FM modulated crystal oscillator circuit.
Figure 2:
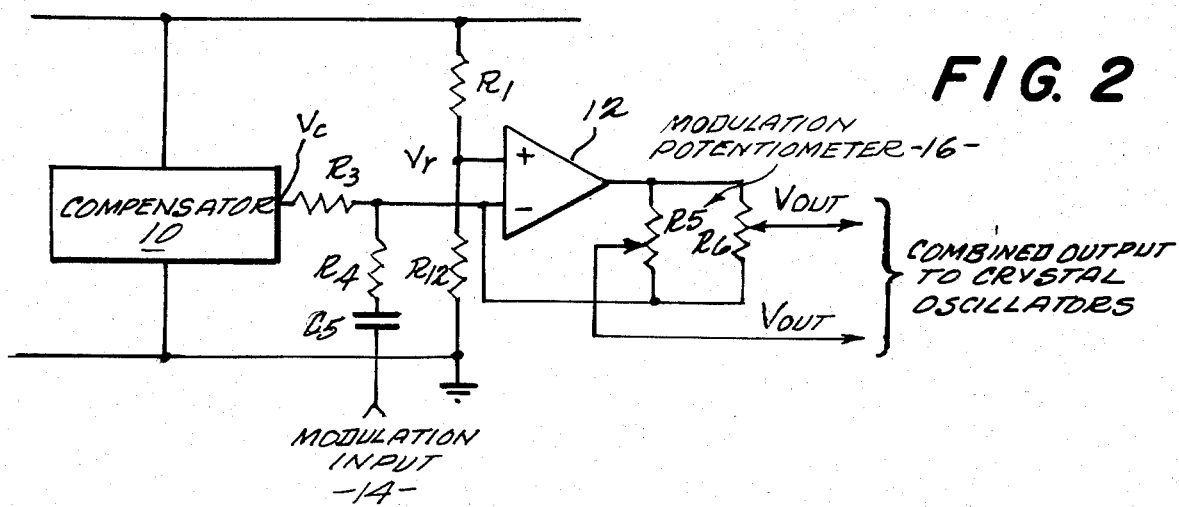
FIG. 2 is a schematic diagram of a first preferred embodiment of the present invention utilizing an operational amplifier circuit.

Referring now to FIG. 2 there is shown a first preferred embodiment of the present invention. This first preferred embodiment utilizes an operational amplifier configuration for minimizing the interaction that would otherwise occur in combining a modulating audio with a temperature compensating bias voltage.

A temperature compensating voltage Vc is generated by a temperature compensator 10. Temperature compensator 10 can be of known construction. The temperature compensating voltage Vc is coupled through the resistor R3 to the inverting input of an operational amplifier 12. A bias is established on the non-inverting input of operational amplifier 12 by a resistive divider including resistors R1 and R2. Audio for modulating the crystal oscillators is applied through a modulation input 14. The audio is coupled through a capacitor C5 and a resistor R4 to the inverting input of operational amplifier 12. The output of operational amplifier 12 is coupled to a modulation potentiometer 16 which feeds back a signal to the inverting input of the operational amplifier and provides one or more output to crystal oscillators. As shown in the Figure, only as an illustrative example, two outputs are shown for driving two crystal oscillators. Each output is formed by the wiper of a resistor of potentiometer 16.

In this circuit arrangement, temperature compensator 10 provides a temperature dependent output voltage Vc. This temperature compensating voltage is coupled to operational amplifier 12 via resistor R3. The output of operational amplifier 12 will be:

$$-\frac{R5}{R3}(V_c - V_r) + V_r = V_{out} \quad (4)$$

Both resistors of modulation potentiometer 16 are equal and are labeled R5.

Referring to equation (4), for a particular temperature To, Vc will equal Vr and therefore $V_{out}$ will equal Vr. At temperature To, $V_{out}$ does not depend on the value of R5. The setting of R5 will not effect the output compensation voltage. At that temperature, the deviation can be adjusted independently of the temperature compensation input. If To is chosen to be room temperature (approximately 25° C.) the setting of modulation potentiometer 16 will have a minor effect on the frequency setting under normal ambient conditions.

Audio modulation is fed to the summing node of operational amplifier 12 through resistor R4 and capacitor C5. Typically this audio will be from a limiter and it will have a fixed magnitude. The magnitude of temperature compensating signal at this node can be selected to achieve a desired ratio in magnitude between temperature compensating voltage and modulating signal. Thus, there will be both an audio and a DC component across resistor R5 except at room temperature where the DC component will be approximately zero. No matter what overall level is established by the wiper positions of modulation potentiometer 16 for the output signal, the predetermined ratio of magnitudes of temperature compensating and modulating signals will remain constant.

Figure 3:
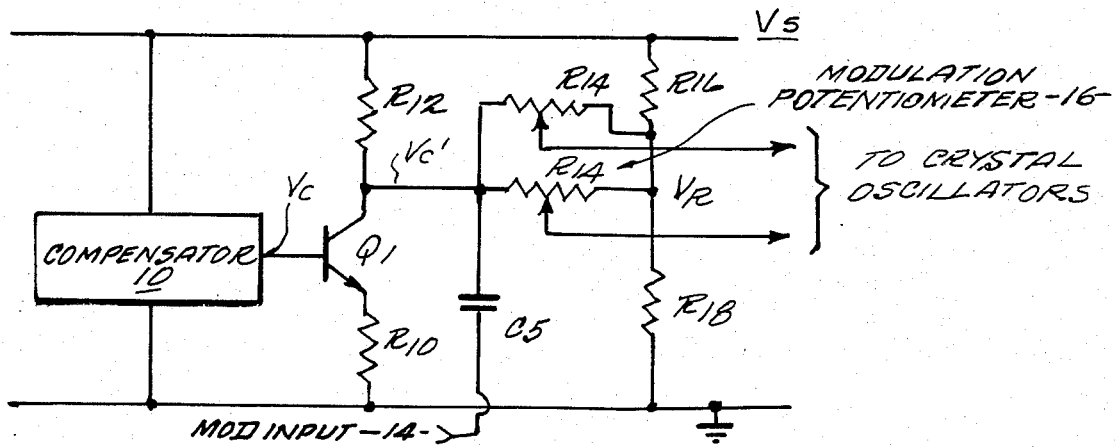
FIG. 3 is a second preferred embodiment of the present invention utilizing a bridge arrangement.

Referring now to FIG. 3 there is shown a schematic diagram of an alternative embodiment of the present invention. This embodiment utilizes a bridge circuit of which the modulation potentiometer is a part. In this embodiment, a temperature compensating bias Vc is established by a temperature compensator 10 as in the FIG. 2 embodiment. However, in this embodiment, the temperature compensating bias Vc is coupled to the base of a transistor Q1 which is biased by resistors R10 and R12. The voltage at the collector of Q1, referred to as Vc' is a linear function of Vc coupled to the base of transistor Q1. Voltage Vc' is coupled to one side of each of resistors R14, the other ends of which are coupled to the center of a resistive divider including resistors R16 and R18. The voltage at the common node of resistors R14 is denoted VR (not to be confused with Vr shown in the FIG. 2 embodiment). A wiper for each of resistors R14 provide the combined output signal to one or more crystal oscillators for providing modulation and temperature compensation. In this embodiment, only two output signals are shown for driving two crystal oscillators. However, this is only an exemplary embodiment, any number of outputs could be taken by extending the circuit concepts on which the specific example is based.

In the FIG. 3 embodiment, resistors R14 combine to form modulation potentiometer 16 which is part of a bridge configuration. Transistor Q1 and resistors R10 and R12 constitute a current mode amplifier. This amplifier may not be necessary if the output impedance of the compensator 10 is adequately high and has an appropriate DC level for biasing the varicap diodes of the oscillators driven by the combining circuit. The following equation applies:

$$V_c' = V_s - V_c \frac{R12}{R10}, \text{ if } V_r = (V_c')T_o \quad (5)$$

where $V_c'$ is the voltage at the collector of Q1 and $(V_c')T_o$ is the collector voltage at room temperature. At $T_o$ there will be no DC output across modulation potentiometer 16 so that the modulation setting will not affect the compensation output which is equal to Vr regardless of the setting of potentiometer 16. Audio modulation can be coupled to the collector of transistor Q1 via modulation input 14 and capacitor C5. If audio gain is desired, the modulation can be coupled to the emitter of transistor Q1.

A slight operational disadvantage of this particular embodiment is that the source impedance of the resistive divider including R16 and R18 must be small compared with the resistance of resistors R14 constituting modulation potentiometer 16. Otherwise, the adjustment range of modulation potentiometer 16 will be limited since the control characteristic for DC and AC will be different. This is in reality not that much of a problem since the input impedance of the varicap modulator of a crystal oscillator is quite high. Thus, resistors R14 can be made in excess of 100 kohms.

As in the case of the FIG. 2 embodiment, the combined signal is established so that there is a constant predetermined ratio of magnitudes of the temperature compensating signal and modulating signal. In this embodiment that ratio exists at the collector of Q1. No matter what wiper positions along R14 are set, the level adjusted combined signal at the wipers will always bear this predetermined ratio.

Other circuit arrangements can be made to produce the same objective i.e. combining an audio modulating signal with a temperature compensating signal such that there is no interaction thereby permitting center frequency and deviation to be adjusted in a simple fashion. Of course, the specific circuit parameters are a function of compensator implementation, bias requirements of the oscillator modulator, available supply voltages, etc.

While the invention has been described in connection with what is presently considered to be the most practical and preferred embodiment, it is to be understood that the invention is not to be limited to the disclosed embodiments but on the contrary is intended to cover various modifications and equivalent arrangements included within the spirit and scope of the appended claims which scope is to be accorded the broadest interpretation so as to encompass all such modifications and equivalent structures.

I claim:

1. A combined modulation and temperature compensating circuit arrangement for driving an oscillator comprising:
    means for receiving a D.C. temperature compensating signal from a temperature compensator;
    means for receiving an A.C. modulating signal;
    combining circuit means, coupled to said temperature compensating receiving signal means and modulating signal receiving means, for providing a combined temperature compensating and modulating signal having a predetermined ratio of magnitude of said D.C. temperature compensating signal and said A.C. modulating signal; and
    adjustable output means for adjusting the level of the output signal of said combining circuit means without changing said predetermined ratio.

2. A circuit according to claim 1 wherein said combining circuit means comprises:
    an amplifier circuit adapted to receive said temperature compensating signal and said modulating signal at a summing node thereof.

3. A circuit according to claim 2 wherein said adjustable output means comprises a potentiometer coupled to an output of said amplifier circuit, a wiper of said potentiometer providing said combined temperature compensating and modulating signal.

4. A circuit according to claim 3 wherein said potentiometer includes two resistors in parallel, each having an independent wiper for providing separate combined temperature compensating and modulating signals to two separate oscillators, respectively, each combined signal having said predetermined ratio.

5. A circuit according to claim 3 wherein said potentiometer includes three or more resistors in parallel, each having an independent wiper for providing separate combined temperature compensating and modulating signals to respective oscillators, each combined signal having said predetermined ratio.

6. A circuit according to claim 1 wherein said combining circuit means comprises a bridge circuit.

7. A circuit according to claim 6 wherein said adjustable output means comprises a potentiometer having a resistor with one end coupled in circuit so as to receive said modulating signal and said temperature compensating signal, the combined temperature compensating and modulating signal being taken from a wiper of said potentiometer.

8. A circuit according to claim 7 wherein said potentiometer includes two resistors in parallel, each having an independent wiper for providing separate combined temperature compensating and modulating signals to separate oscillators, respectively.

9. A combined modulation and temperature compensating circuit arrangement for receiving a temperature compensating signal and a modulating signal and providing in response thereto a combined temperature compensating and modulating signal for driving an oscillator comprising:
    an operational amplifier having a summing node input and an output;
    means for coupling a temperature compensating signal from a temperature compensating signal generator to said summing node;
    means for coupling a modulation signal to said summing node, there being provided at said output of said operational amplifier a combined temperature compensating and modulating signal having a predetermined ratio between the magnitudes of said signals; and
    a potentiometer including a resistor having a first end coupled to said output of said operational amplifier, a second end coupled to said summing node and a wiper for providing a level controlled combined temperature compensating and modulating signal for driving an oscillator, said predetermined ratio being maintained regardless of the overall level set by said wiper.

10. A circuit according to claim 9 wherein said potentiometer comprises two resistors in parallel, each having an independent wiper for providing independent combined temperature compensating and modulating signals for driving two different oscillators, respectively, each combined signal having said predetermined ratio.

11. A circuit according to claim 9 wherein said potentiometer comprises three or more resistors in parallel, each having an independent wiper for providing independent temperature compensating signals to respective oscillators, each combined signal having said predetermined ratio.

12. A circuit according to claim 9 wherein said summing node is the inverting input of said operational amplifier, said amplifier also including a non-inverting input.

13. A circuit according to claim 12 further comprising means for biasing said non-inverting input.

14. A circuit according to claim 9 wherein said modulation signal coupling means comprises a series resistor-capacitor circuit.

15. A circuit according to claim 9 wherein said combined temperature compensating and modulating circuit arrangement is integrated on a substrate on which is also integrated said temperature compensating signal generator.

16. A combined modulation and temperature compensating circuit arrangement for receiving a temperature compensating signal and a modulating signal and providing in response thereto a combined temperature compensating and modulating signal for driving an oscillator comprising:

a resistive bridge including a pair of fixed resistors and at least one variable resistor having two ends and a wiper;

means for coupling a temperature compensating signal from a temperature compensating signal generator to a first end of said variable resistor, said other end of said variable resistor being coupled to a junction of said fixed resistors;

means for coupling a modulation signal to said first end of said variable resistor, said wiper providing a level adjustable combined temperature compensating and modulating signal always having a constant predetermined ratio of magnitude of temperature compensating and modulating signals.

17. A circuit arrangement according to claim 16 further including an amplifier for amplifying said temperature compensating signal from said temperature compensating signal generator before it is coupled to said first end of said variable resistor.

18. A circuit arrangement according to claim 17 wherein said amplifier comprises a transistor amplifier.

19. A circuit arrangement according to claim 18 wherein said modulation signal coupling means comprises means for coupling said modulating signal to an emitter of said transistor so as to provide an amplification thereof.

20. A circuit arrangement according to claim 18 wherein said modulation signal coupling means comprises means for coupling said modulating signal to a base of said transistor so as to provide an amplification thereof.

21. A circuit arrangement according to claim 16 wherein said combined temperature compensating and modulating circuit arrangement is integrated on a substrate on which is also integrated said temperature compensating signal generator.

22. A circuit arrangement according to claim 16 wherein said potentiometer includes two resistors in parallel each having an independent wiper for providing independent combined temperature compensating and modulating signals for driving two different oscillators, respectively, each combined signal having said predetermined ratio.

* * * * *